United States Patent [19]

Larson et al.

[11] Patent Number: 4,471,415
[45] Date of Patent: Sep. 11, 1984

[54] MOUNTING BAR FOR SPACING INDICATOR LIGHTS

[75] Inventors: Gregory R. Larson, White Bear Lake, Minn.; Gregory L. Pettis, Huron, S. Dak.

[73] Assignee: Wilbrecht Electronics, Inc., St. Paul, Minn.

[21] Appl. No.: 506,202

[22] Filed: Jun. 20, 1983

[51] Int. Cl.³ .............................................. F21V 21/14
[52] U.S. Cl. .................................... 362/250; 362/249; 362/285; 362/389; 362/396; 362/800
[58] Field of Search ............... 362/249, 250, 285, 389, 362/396, 800

[56] References Cited

U.S. PATENT DOCUMENTS 3,540,687  11/1970  Cuva .................................. 362/249

*Primary Examiner*—Stephen J. Lechert, Jr.
*Attorney, Agent, or Firm*—Williamson, Bains, Moore & Hansen

[57] ABSTRACT

A mounting bar for spacing and retaining indicator lights for use with electronic equipment. An elongated channel bar includes a cavity extending along the front wall of the bar. Light emitting diode (LED) modules having light emitting diodes (LED's) mounted therein are frictionally engaged to the bar within the elongated cavity at predetermined locations. This permits LED modules to be mounted and arranged at predetermined spacings as requested by the user without retooling or special handling. The LED modules also include connector leads extending perpendicular from the LED's for connection to a printed circuit board of electronic equipment.

16 Claims, 4 Drawing Figures

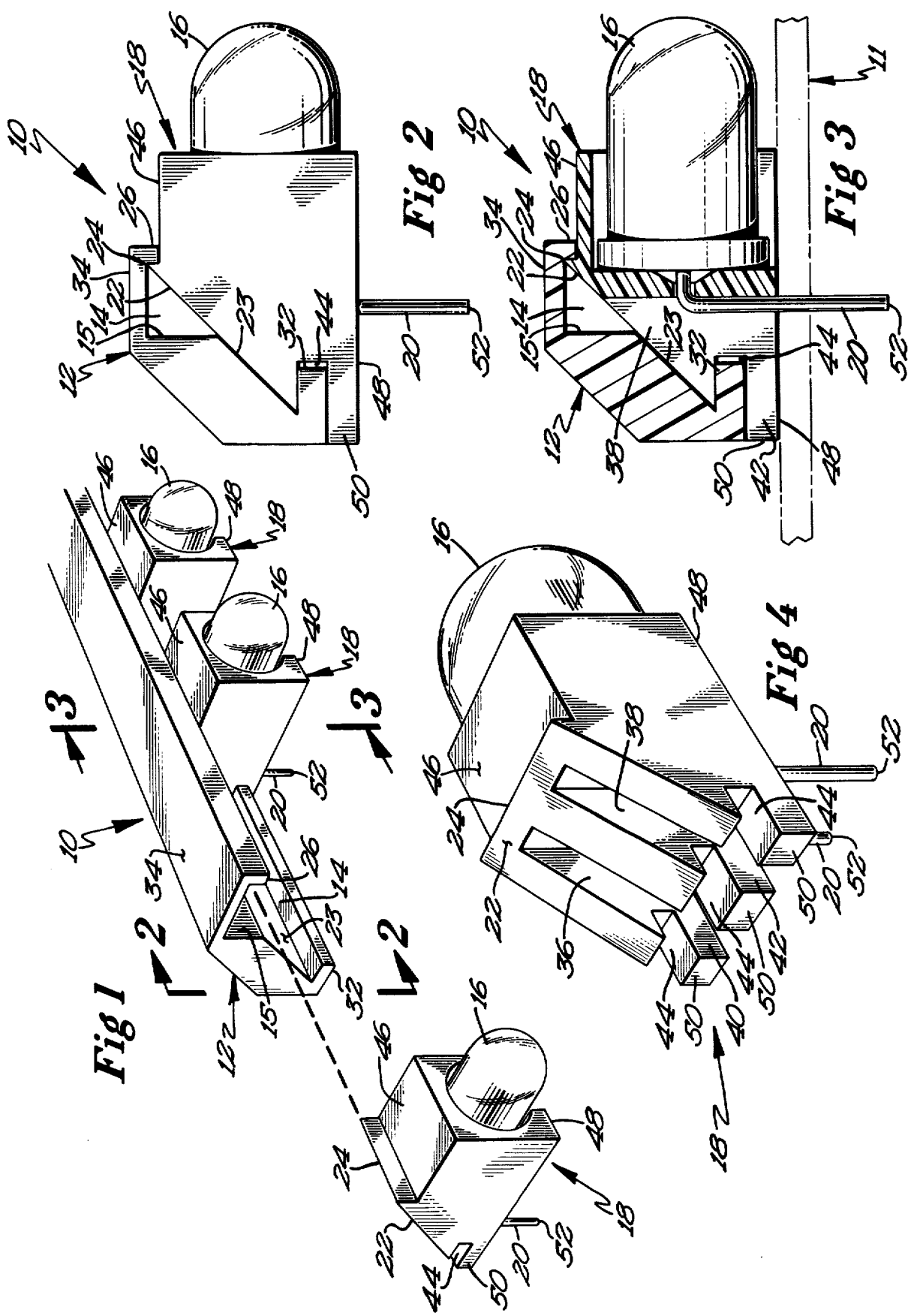

MOUNTING BAR FOR SPACING INDICATOR LIGHTS

BACKGROUND OF THE INVENTION

The invention relates to the field of mounting structures for indicator lights and provides a new mounting system for retaining indicator lights or light emitting diode (hereinafter LED) modules at predetermined spacings along a mounting bar adjacent a printed circuit board of electronic equipment with electrical connection means extending outwardly and perpendicular to the indicator lights or LED's.

In recent years, manufacturers of electronic equipment, including computers, electrical instruments, and copying machines, have used forms of indicator lights or LED devices to serve as function indicators. The manufacturers of such electronic equipment have previously had to purchase individual indicator lights or LED modules and then arrange the indicator lights or modules to their spacing requirements. This process requires special tooling and handling which is an expensive process. It is highly desirable, therefore, that a mounting system for indicator lights or LED modules be made which permits the manufacturer to arrange and mount such light indicators at the predetermined variable spacings as desired in the customer's specifications.

In the past, indicator lights or the LED indicators have been mounted in individual sockets and subsequently spaced at the desired positions. U. S. Pat. No. 3,927,315 is representative of this individual socket approach. The individual socket method for spacing such indicators is an expensive process, as the manufacturer's assembly and insertion time is significantly increased. It is further desirable, therefore, that a mounting system for retaining indicator lights or LED indicators be capable of mounting several such indicators in one operation, as this process will significantly reduce the manufacturer's assembly and insertion time.

Indicator lights or LED's will eventually burn out or fail. It has, therefore, also been found desirable to provide a mounting bar for spacing indicator lights which permits replacing an individual indicator light or LED along the mounting bar, when a particular indicator light or LED burns out or fails, without the necessity of replacing the entire series of light indicators.

In many electrical equipment applications, the printed circuit board of the electrical equipment transmitting the designated signals to the function indicator lights or LED's is arranged parallel to the indicator lights or LED's. Therefore, it is highly desirable to design a mounting bar for spacing indicator lights or LED's which is designed to permit electrical connector leads to extend outwardly and perpendicular from the indicator lights for engagement with the printed circuit board of the electrical equipment.

The mounting bar disclosed herein for spacing and retaining indicator lights or LED modules has been designed with a view towards overcoming the aforesaid problems.

BRIEF SUMMARY OF THE INVENTION

This invention is directed to a mounting bar for spacing indicator lights or LED modules used with electronic equipment, and is particularly characterized by an elongated channel bar for receiving and retaining indicator light modules or LED modules at the predetermined variable spacing as required for use. The indicator lights or LED modules may be frictionally engaged with the cavity of the channel bar and positioned at the desired spacing requirements of the user. The indicator lights or LED modules include indicator lights or LED's which serve as function indicators and are preferably furnished in various colors for use in different types of electronic equipment, including computers, instruments, copying machines, etc.

The indicator lights or LED modules also include electrical conductor leads extending outwardly and perpendicular from the indicator lights or LED's and providing for an electrical connection. It is anticipated that such connection will most often be with a printed circuit board of the electrical equipment. The modules further include a tip extending upwardly and adjacent to the top housing of the modules which cooperates with a vertical top flange extending downwardly from the horizontal top wall of the channel bar to frictionally engage the modules within the cavity of the channel bar.

The modules also advantageously include a horizontal slot which engages a horizontal base flange of the channel bar to facilitate the retention of the modules along the channel bar. A horizontally extending base lip on the modules provides a support means for retaining the horizontal base flange of the channel bar within the horizontal slot of the modules.

The light modules also have vertical slots which extend along and into the rear face of the modules and continue downwardly along and into the aforesaid bottom lip of the modules. These vertical slots provide for separation of the electrical connector leads, as well as for the extension of the leads at right angles to the direction of extent of the channel bar.

The cavity of the channel bar also includes a slanted portion which abuts an angular rear face of the modules when the modules are engaged with the cavity of the channel bar. The cooperation between the slanted portion of the cavity and the angular rear face of the modules aids in the alignment of the modules within the cavity and facilitates the retention of the modules within the cavity on the bar.

The channel bar is preferably made of a plastic or plastic-like material for increasing its elastic characteristics so that the modules may be better frictionally engaged and retained within the channel bar.

The invention is structured to permit the replacement of an individual indicator light or LED module without the necessity of replacing the entire series of indicator lights or LED modules. Since the invention does not employ any adhesion means to permanently secure the modules along the channel bar, an individual indictor light or LED module may be replaced by snapping the defective indictor light or LED out of the channel in the bar and inserting a new indicator light in its place.

BRIEF DESCRIPTION OF THE DRAWINGS

FIG. 1 is a front perspective view of an embodiment of the mounting bar for spacing indicator lights with an exploded view of an individual indicator light module;

FIG. 2 is an end view of the mounting bar for spacing indicator lights of FIG. 1 taken along line 2—2;

FIG. 3 is a vertical sectional view of the mounting bar for spacing indicator lights of FIG. 1 taken along line 3—3; and FIG. 4 is a rear perspective view of an embodiment of an individual indicator light module.

DESCRIPTION OF THE PREFERRED EMBODIMENT

Referring now to FIG. 1, a mounting bar assembly 10 for spacing indicator lights retains a plurality of indicator light or LED modules 18 along an elongated channel bar 21. The indicator light or LED modules 18 include an indicator light or LED 16 mounted within the modules 18 as shown in FIG. 3. These indicator lights or LED's 16 preferably serve as function indicators for the particular piece of electrical equipment in which the mounting bar for spacing indicator lights 10 is used.

A cavity 14 extends along the entire front face 15 of the channel bar 12. The modules 18 are frictionally engaged within the cavity 14 of the channel bar 12 and arranged along the channel bar 12 at the desired predetermined spacing, as requested by the user. This assembly structure provides for a continuous spacing of indicator lights or LED's 16. In this manner, the modules 18 can be mounted and arranged along the channel bar 12 at the variable spacing requirements as requested by the user without the necessity of retooling or special handling.

The design of the channel bar 12 and the modules 18 facilitates the retention of the modules 18 within the channel bar 12. The modules 18 include a tip 24 extending upwardly and adjacent to the top housing 46 of each module. The tip 24 engages a vertical top flange 26 of the channel bar 12 which extends downwardly from the horizontal top wall 34 of the channel bar 12 when the modules 18 are frictionally engaged with the cavity 14. The modules 18 also include a horizontal slot 44 which provides a retention means for securely engaging the modules 18 with the horizontal base flange 32 of the channel bar 12. The horizontal slots 44 allow the modules 18 to be positioned along the horizontal base flange 32 of the channel bar 12 and provide a stabilizing means so that the device 10 may sit flush to a printed circuit board 11, as shown in FIG. 3. A lip 50 extends outwardly from the bottom housing 48 of the modules 18 and engages the bottom of horizontal base flange 32 of the channel bar 12 underneath the base flange 32. This structural arrangement provides a support means for supporting the horizontal base flange 32 of the channel bar 12 within the horizontal slot 44 of the modules 18. The vertical top flange 26 depending from the horizontal top wall 34 of the channel bar 12 overlapping the tip 24 of the modules 18 and the horizontal base flange 32 of the channel bar 12 engaging within the horizontal slots 44 of the modules 18 cooperate to retain the modules 18 within the cavity 14 of the channel bar 12. These cooperating retention elements also permit the modules 18 to be frictionally engaged and retained along the channel bar 12 at the predetermined spacing requirements of the user with minimal effort.

The modules 18 further include an angular rear face 22 extending from the tip 24 to the horizontal slot 44. The angular rear face 22 of the modules 18 cooperates and abuts with a slanted portion 23 of the cavity 14 to align the modules 18 within the cavity 14 when the modules 18 are frictionally engaged along the cavity 14. The angular rear face 22 of the modules 18 also cooperates with the slanted portion 23 of the cavity 14 to facilitate the retention of the modules 18 within the channel bar 12.

The modules 18 also include electrical connector leads 20, as best shown in FIG. 3, which extend outwardly and perpendicularly to the indicator light or LED 16 and provide for a connection means between the indicator light or the LED 16 and the electrical equipment. Two such leads will normally be connected to each indicator light or LED. The most common form of electrical connection will be to a printed circuit board, as indicated at 11 in FIG. 3. The lower end 52 of the electrical connector leads 20 contacts the printed circuit board 11 of the electrical equipment so as to provide an electrical connection therewith. The printed circuit board 11 is preferably positioned generally parallel to channel bar 12 and to the direction of the light being emitted by the indicator lights or LED's 16. Thus, connector leads 20 will extend at right angles to channel bar 12 and the indicator light direction.

Vertical slots 36 and 38, as best shown in FIG. 4, extend along and into the angular rear face 22 of the modules 18 and continue along and into the outwardly extending lip 50 of the bottom housing 48 of the modules 18 as vertical slots 40 and 42. Vertical slots 36, 38 and 40, 42 provide a means for separating and guiding the electrical connector leads 20 of the modules 18.

The channel bar 12 is preferably made of a plastic or plastic-like material thereby permitting its elastic displacement so that the modules 18 will be better retained along the cavity 14 when frictionally engaged therewith. The preferred mode of manufacture is to mold channel bar 12 from polycarbonate.

The device 10 is "relampable" in the field; that is, an individual indicator light or LED 16, after burning out or failing, may be removed and replaced by a new module 18 without the necessity of replacing the entire device 10 or series of of modules 18. Since the modules 18 are frictionally engaged within the cavity 14 by the cooperative engagement of the tip 24 with the vertical top flange 26 of the channel bar 12 and of the horizontal slot 44 of the modules 18 with the horizontal base flange 32 of the channel bar 12, no adhesion means are necessary to permanently secure the modules 18 within the cavity 14. A module 18 of a defective indicator light or LED 16 may be simply snapped out from the cavity 14 and a new indicator light or LED module 18 may be frictionally engaged within the cavity 14.

In operation, a plurality of modules 18 are arranged and held at the variable predetermined spacing requirements of the user by means of a production tool or cradle. The plurality of modules 18 are then frictionally engaged along the cavity 14 of the channel bar 12 by engaging the vertical top flange 26 of the channel bar 12 over the upwardly extending tip 24 of each module 18, and by forcing the horizontal base flange 32 of the channel bar 12 within the horizontal slot 44 of the modules 18 on top of the lip 50. The tip 24 engaging the vertical top flange 26 of the channel bar 12 cooperates with the horizontal base flange 32 of the channel bar 12, engaging the horizontal slot 44 of the modules 18 to frictionally retain the modules 18 along the cavity 14 at the predetermined spacing requirements of the user without the need for commercially available adhesion means, such as sonic welding or gluing. This mounting system insures consistent, repeatable spacing of light indicator modules for a particular application without the high cost of custom designing and molding for different electrical equipment.

The modules 18 are positioned within the cavity 14 until the angular rear face 22 of the modules 18 contacts the slanted portion 23 of the cavity 14. The abutment of the angular rear face 22 of the modules 18 and the slanted portion 23 of the cavity 14 permits the modules 18 to be aligned and oriented properly within the cavity 14 and also facilitates the retention of the modules 18 within the channel bar 12.

The lips 50 extending outwardly from the bottom housing 48 of the modules 18 also provide for a support means in use. The lips 50 serve as a base so that the modules 18 will sit flush and stable against the printed circuit control board 11.

The electrical connector leads 20, separated by vertical slots 36 and 38, extend outwardly and perpendicularly to the indicator lights or LED's 16, and the lower end 52 of the electrical connector leads 20 contact the printed circuit board 11 of the electrical equipment. In this manner, the electrical connector leads 20 extend generally perpendicular to the indicator lights or LED's 16 and the direction of the light emitted.

An individual module 18 may be replaced along the device 10 for removing defective indicator lights or LED's 16 by disengaging the vertical top flange 26 of the channel bar 12 from the tip 24 of the defective module 18 and by disengaging the horizontal base flange 32 from the horizontal slot 44. A new module 18 with a replacement indicator light or LED 16 may be reinserted and frictionally engaged with the channel bar 12 in the same manner as stated previously.

While the preferred embodiments of the present invention have been described, it should be understood that various changes, adaptions and modifications may be made therein without departing from the spirit of the invention and the scope of the appended claims.

We claim:

1. A mounting bar for spacing indicator lights used in electronic equipment comprising:
   an elongated channel bar of uniform cross-section having a cavity extending along its entire length and also including a horizontal top wall and horizontal base flange;
   a plurality of indicator light modules having indicator lights mounted therein, said modules including an upper and bottom housing, said modules also including a base support means, said plurality of indicator light modules being frictionally engaged within said cavity at fixed, predetermined spaced locations continuously along the length thereof, with said upper and bottom module housings being restrainably engaged by said channel bar top wall and base flange, respectively; and
   electrical connection means extending outwardly from and perpendicular to said indicator lights for providing electrical connection between said indicator lights and the electrical equipment.

2. The mounting bar for spacing indicator lights of claim 1 wherein:
   said channel bar includes a vertical top flange depending downwardly from said horizontal top wall; and
   said modules have a tip extending upwardly and adjacent to said top housing, said tip cooperating with and engaging said vertical top flange to aid in retention of said modules within said cavity.

3. The mounting bar for spacing indicator lights of claim 1 wherein:
   said modules including a horizontal slot which cooperates with and engages said horizontal base flange when said modules are frictionally engaged with said cavity to aid in retaining said modules within said cavity.

4. The mounting bar for spacing indicator lights of claim 1 wherein:
   said modules include an angular rear face; and
   said cavity includes a slanted portion which abuts and cooperates with said angular rear face when said modules are frictionally engaged along said channel bar to aid in aligning said modules within said cavity and retaining said modules within said cavity.

5. The mounting bar for spacing indicator lights of claim 1 wherein:
   said support means of said modules extends outwardly from said bottom housing, and engages with and cooperates with said horizontal base flange when said modules are frictionally engaged along said channel bar.

6. The mounting bar for spacing indicator lights of claim 1 wherein:
   said modules include vertical slots which provide for separation of said electrical connection means.

7. The mounting bar for spacing indicator lights of claim 6 wherein:
   said modules further include a horizontal slot which cooperates with and engages said horizontal base flange when said modules are frictionally engaged with said cavity, said horizontal slot passing through and intersecting said vertical slots; and
   said electrical connection means comprise conductor leads which extend from said indicator lights into said vertical slots and thence down through said horizontal slot at right angles to the direction of extent of said channel bar for connection to electrical equipment circuitry.

8. The mounting bar for spacing indicator lights of claim 1 wherein:
   said channel bar is molded from a plastic or plastic-like material.

9. A mounting bar assembly for spacing indicator lights adjacent a printed circuit board of electrical equipment comprising:
   an elongated channel bar having a cavity extending along its entire length and including a horizontal top wall and horizontal base flange, said channel bar also including a vertical top flange depending from said horizontal top wall;
   a plurality of indicator light modules having indicator lights mounted therein, said modules including an upper and bottom housing, said modules also including a support means, said plurality of modules being frictionally engaged with said cavity at fixed, predetermined spaced locations continuously along the length thereon, said modules also having a tip extending upwardly and adjacent to said top housing which cooperates with and engages said vertical top flange to aid in retention of said modules within said cavity;
   said support means extending outwardly from said bottom housing and cooperating with and engaging said horizontal base flange when said modules are frictionally engaged along said channel bar to support said modules along the printed circuit board; and
   connection means extending outwardly and perpendicular from said indicator lights and contacting the printed circuit board of the electrical equipment and providing electrical connection between said indicator lights and the electrical equipment.

10. The mounting bar for spacing indicator lights of claim 9 wherein:

said modules include a horizontal slot which cooperates with and engages said horizontal base flange when said modules are frictionally engaged with said cavity to aid in retaining said modules within said cavity.

11. The mounting bar for spacing indicator lights of claim 9 wherein:

said modules include an angular rear face; and said cavity includes an angular slanted portion which abuts with and cooperates with said angular rear face when said modules are frictionally engaged along said channel bar to aid in aligning said modules within said cavity and retaining said modules within said cavity.

12. The mounting bar for spacing indicator lights of claim 11 wherein:

said modules include vertical slots which extend through said support means and provide for separation and guidance of said connection means.

13. The mounting bar for spacing indicator lights of claim 9 wherein:

said channel bar is molded from plastic material.

14. A mounting bar for spacing indicator lights adjacent a printed circuit board of electrical equipment comprising:

an elongated channel bar having a cavity extending along its entire length and also including a horizontal top wall and horizontal base flange, said channel bar also including a vertical top flange depending downwardly from said horizontal top wall;

a plurality of indicator light modules having indicator lights mounted therein, said modules including an upper and bottom housing, said modules also including a support means, said plurality of modules being frictionally engaged with said cavity at fixed, predetermined, spaced locations continuously along the length of said mounting bar, said modules also having a tip extending upwardly and adjacent to said top housing which engages said vertical top flange when the modules are frictionally engaged with said cavity, said modules further having a horizontal slot which engages said horizontal base flange when said modules are frictionally engaged with said cavity, the engagement of said vertical top flange with said tip and the engagement of said horizontal base flange with said horizontal slot cooperating to retain said modules within said cavity when said modules are frictionally engaged along said channel bar;

said support means extending outwardly from said bottom housing and cooperating with and engaging said horizontal base flange when said modules are frictionally engaged along said channel bar to support said modules along the printed circuit board; and connection means extending outwardly and perpendicular from said indicator lights and contacting the printed circuit board of the electrical equipment and providing electrical connection between said indicator lights and the electrical equipment.

15. The mounting bar for spacing indicator lights of claim 14 wherein:

said modules include an angular rear face; and said cavity includes a slanted wall portion which abuts with and cooperates with said angular rear face when said modules are frictionally engaged along said channel bar to aid in aligning said modules with said cavity and retaining said modules therein.

16. The mounting bar for spacing indicator lights of claim 14 wherein:

said modules include vertical slots which provide for separation of said connection means.

* * * * *